(12) United States Patent
Zhang

(10) Patent No.: US 11,790,960 B2
(45) Date of Patent: Oct. 17, 2023

(54) DATA TRANSMISSION CIRCUIT, METHOD AND STORAGE DEVICE

(71) Applicant: ChangXin Memory Technologies, Inc., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 142 days.

(21) Appl. No.: 17/626,794

(22) PCT Filed: Aug. 18, 2021

(86) PCT No.: PCT/CN2021/113243
§ 371 (c)(1),
(2) Date: Jan. 12, 2022

(87) PCT Pub. No.: WO2022/217797
PCT Pub. Date: Oct. 20, 2022

(65) Prior Publication Data
US 2023/0274771 A1  Aug. 31, 2023

(30) Foreign Application Priority Data
Apr. 13, 2021  (CN) .......................... 202110397018.X

(51) Int. Cl.
*G11C 7/00* (2006.01)
*G06F 13/00* (2006.01)
(Continued)

(52) U.S. Cl.
CPC .......... *G11C 7/1048* (2013.01); *G11C 7/1006* (2013.01); *G11C 7/1096* (2013.01)

(58) Field of Classification Search
CPC ... G11C 7/1006; G11C 7/1048; G11C 7/1057; G11C 7/10; G11C 7/1084; G11C 7/1096; G06F 3/0656; G06F 3/0625
(Continued)

(56) References Cited

U.S. PATENT DOCUMENTS 6,351,427 B1   2/2002  Brown
7,139,852 B2 * 11/2006  LaBerge ............. G06F 13/4243
                                                        365/233.17
(Continued)

FOREIGN PATENT DOCUMENTS

CN    1487528 A     4/2004
CN   201667806 U   12/2010
(Continued)

OTHER PUBLICATIONS

PCT/CN2021/113243 International Search Report and Written Opinion dated Jan. 13, 2022, English translation of Search Report.

*Primary Examiner* — Ly D Pham
(74) *Attorney, Agent, or Firm* — Alston & Bird LLP

(57) ABSTRACT

This application relates to a data transmission circuit, method, and storage devices. The comparison module compares the bus data on the data bus with the global data on the global data line, and the comparison result shows whether the number of bits that are different from the global data on the output bus data exceeds the preset threshold, which is set based on the comparison result. When the comparison result exceeds the preset threshold, a first data conversion module inverts the bus data and provides it to the data bus buffer module, and when the comparison result does not exceed the preset threshold, the bus data is provided to the data bus buffer module. The data bus buffer module generates a data polarity identification signal according to the comparison result, and transmit the bus data or the inverted data of the bus data to the global data line. The write circuit module
(Continued)

transmits data on the global data line or inverted data to the local data line according to the data polarity identification signal.

15 Claims, 8 Drawing Sheets

(51) Int. Cl.
*G11C 11/409* (2006.01)
*G11C 7/10* (2006.01)

(58) Field of Classification Search
USPC .......................................................... 365/191
See application file for complete search history.

(56) References Cited

U.S. PATENT DOCUMENTS

| | | | | |
|---|---|---|---|---|
| 2022/0310136 A1* | 9/2022 | Zhang | .................... | G11C 5/063 |
| 2022/0310139 A1* | 9/2022 | Zhang | .................. | G11C 7/1096 |
| 2022/0310141 A1* | 9/2022 | Zhang | .................. | G11C 7/1057 |
| 2022/0328079 A1* | 10/2022 | Zhang | .................. | G11C 7/1045 |
| 2022/0328120 A1* | 10/2022 | Zhang | .................... | G11C 29/42 |

FOREIGN PATENT DOCUMENTS

| | | |
|---|---|---|
| CN | 211125038 U | 7/2020 |
| CN | 211404065 U | 9/2020 |

\* cited by examiner

DATA TRANSMISSION CIRCUIT, METHOD AND STORAGE DEVICE

CROSS REFERENCES TO RELATED APPLICATIONS

This application claims the priority of the Chinese patent application with the application number 202110397018.X and entitled "DATA TRANSMISSION CIRCUIT, METHOD AND STORAGE DEVICE", filed on Apr. 13, 2021, the content of which is incorporated herein by reference in its entirety.

TECHNICAL FIELD

This application relates to a data transmission circuit, method and storage device.

BACKGROUND

With rapid development of semiconductor technologies, the market has ever higher requirements for storage capacity and power saving performance of semiconductor storage devices. This puts forward higher requirements on the power-saving performance of the peripheral circuit area and the storage array area of the control circuit used to control read and write in the semiconductor storage device.

However, due to the increase in the density and number of storage units in the storage unit array, in the process of writing data into the semiconductor storage device, the power consumption of the writing data into the storage unit array via the data bus increases at the same time. The data transfer rate is reduced.

If under the condition that the density and number of storage units in the storage unit array are not reduced, the power consumption in the process of writing data into the storage unit array via the data bus can be reduced, thereby increasing the possibility of improving the storage capacity and reducing energy consumption of the semiconductor storage devices.

SUMMARY

One embodiment of the disclosure provides a data transmission circuit, including a comparison module, a first data conversion module, a data bus buffer module, and a write circuit module. The comparison module receives the bus data from the data bus and the global data from the global data line, and compares the bus data with the global data to output a comparison result whether the difference between the numbers of bits of the bus data and the global data exceeds a preset threshold. The bus data and the global data have the same preset bit width. The first data conversion module is electrically connected to the data bus, the comparison module, and the global data line, and will invert and output the bus data when the comparison result exceeds the preset threshold, and output the bus data if the comparison result does not exceed the preset threshold. The data bus buffer module, the first data conversion module, and the comparison module are electrically connected to the global data line, and are used to generate a data polarity identification signal according to the comparison result, and are also used to transmit the bus data or the inverted data of the bus data to the global data line. The write circuit module is electrically connected to the global data line, the local data line and the complementary local data line, and is used to transmit the global data on the global data line or inverted to the local data line according to the data polarity identification signal line, wherein the local data line and the complementary local data line transmit signals of opposite phases.

One embodiment of the present application also provides a storage device, including the above-mentioned data transmission circuit, for storing and transmitting data of a read operation or a write operation.

The embodiment of the present application also provides a data transmission method, including: comparing the bus data on the data bus with the global data on the global data line, and outputting the number of bits that is different from the global data on the bus data, if the comparison result exceeds a preset threshold. Herein the bus data and the global data have the same preset bit width. If the comparison result exceeds the preset threshold, the bus data is inverted and provided to the data bus buffer module; otherwise, the bus data is provided to the data bus buffer module. Herein the data bus buffer module is used to generate a data polarity identification signal according to the comparison result, and is used to transmit the bus data or the inverted bus data to the global data line. According to the data polarity identification signal, the global data on the global data line or the inverted data is transmitted to the local data line.

The details of various embodiments of the present disclosure will be illustrated in the following drawings and descriptions. According to the description in the specification, drawings and claims, those skilled in the art will easily understand the other features, the problems to be solved and the technical results of the present disclosure.

BRIEF DESCRIPTION OF THE DRAWINGS

To clearly describe the technical features in the embodiments of the present application or the existing technology, the following texts will briefly introduce the drawings used in the description of the embodiments or the existing technology. Obviously, the drawings in the following description are merely present for some of the embodiments of the application, for those of ordinary skill in the art, other drawings can be obtained based on these drawings without any creative work.

FIG. 4b is a schematic diagram according to the embodiment of FIG. 4a;

DETAILED DESCRIPTION OF THE PREFERRED EMBODIMENTS

To facilitate the understanding of this application, the following will make a more comprehensive description of this application with reference to the relevant drawings. The preferred embodiment of the application is shown in the accompanying drawings. However, this application can be implemented in many different forms and is not limited to the embodiments described herein. On the contrary, the purpose of providing these embodiments is to make the disclosure of this application more thorough and comprehensive.

Unless otherwise defined, all technical and scientific terms used herein have the same meaning as commonly understood by those skilled in the technical field of this application. The terminology used in the specification of the application herein is only for the purpose of describing specific embodiments, and is not intended to limit the application. In addition, certain terms used throughout the specification and the following claims refer to specific elements. Those skilled in the art will understand that manufacturers can refer to components with different names. This document does not intend to distinguish between components with different names but the same functions. In the following description and examples, the terms "including" and "including" are used openly, and therefore should be interpreted as "including, but not limited to . . . ". Likewise, the term "connected" is intended to express an indirect or direct electrical connection. Correspondingly, if one device is connected to another device, the connection can be done through a direct electrical connection, or through an indirect electrical connection between the other equipment and the connector. It should be understood that although the terms "first", "second", etc. may be used herein to describe various elements, these elements should not be limited by these terms. These terms are only used to distinguish one element from another element. For example, without departing from the scope of the present application, the first element may be referred to as the second element, and similarly, the second element may be referred to as the first element.

Figure 1:
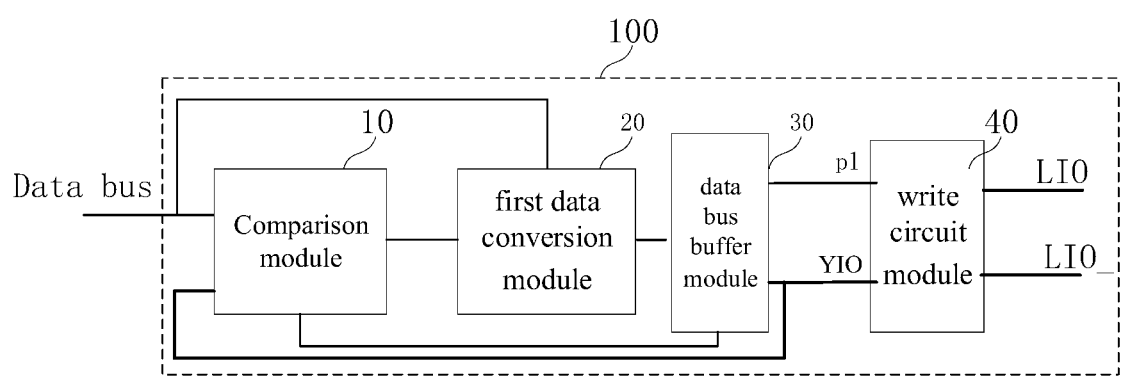
FIG. 1 is a schematic diagram of the circuit overview of a data transmission circuit provided in the first embodiment of this application.

Please refer to FIG. 1, in an embodiment of the present application, a data transmission circuit 100 is provided, including a comparison module 10, a first data conversion module 20, a data bus buffer module 30, and a write circuit module 40. The comparison module 10 receives the bus data on the data bus and the global data on the global data line YIO, and compares the bus data with the global data to output the number of bits that are different from the global data to see if the number exceeds a preset threshold. Herein the bus data and the global data have the same preset bit width. The first data conversion module 20 and the data bus, the comparison module 10, the global data lines YIO are all electrically connected for outputting the bus data. When the comparison result exceeds the preset threshold value, the bus data is inverted; and when the comparison result does not exceed the preset threshold value, the bus data is outputted. The data bus buffer module 30 is electrically connected to the first data conversion module 20, the comparison module 10, and the global data line YIO, and is used to generate a data polarity identification according to the comparison result. The signal pl, and the bus data or the inverted bus data are transmitted to the global data line YIO. The write circuit module 40 and the data bus buffer module 30, the global data line YIO, the local data line LIO and complementary local data lines LIOs are electrically connected for transmitting the global data on the global data line YIO or inverted to the local data line LIO according to the data polarity identification signal pl, where the local data line LIO and the complementary local data line LIO_Transmit signals with opposite phases.

Specifically, referring to FIG. 1, by setting the comparison module 10 to receive the bus data on the data bus and the global data on the global data line YIO, and compare the bus data with the global data to output the comparison result to see whether the number of bits that are different between the bus data and the global data exceeds a preset threshold, herein the bus data and the global data have the same preset bit width. If the comparison result exceeds a preset threshold, the first data conversion module 20 inverts the bus data and outputs the data. If the comparison result does not exceed the preset threshold, then outputs the bus data. By setting a data bus buffer module 30 which generates the data polarity identification signal pl according to the comparison result, and transmits the global data or the data after the global data inversion to the global data line YIO, the write circuit module 40 can transfer the data polarity identification signal pl according to the data polarity identification signal pl. The global data on the global data line YIO can be inverted and then transmitted to the local data line LIO. The local data line LIO and the complementary local data line LIO_ transmit signals with opposite phases to reduce data while ensuring the accuracy of data transmission. Through the data bus, the global data line YIO and the local data line LIO, or the data through the data bus, the global data line YIO and the complementary local data line LIO_, the number of flips during the transmission process, in order to effectively reduce the data through the data bus, global data line YIO and local data line LIO, or power consumption during data transmission via data bus, global data line YIO and complementary local data line LIO_. Therefore, the energy consumption of the semiconductor storage device is reduced while ensuring that the density and number of storage units in the storage unit array are not reduced.

Figure 2:
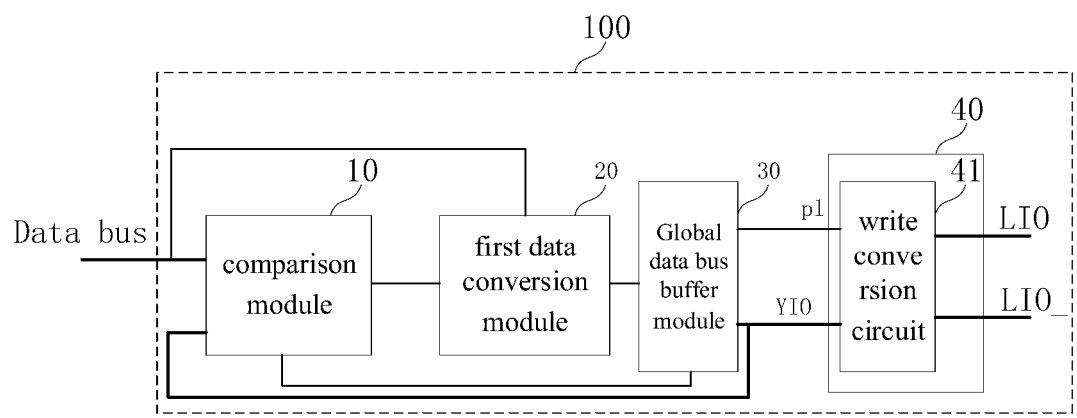
FIG. 2 is a schematic diagram of the circuit overview of a data transmission circuit provided in the second embodiment of this application.

Refer to FIG. 2, as an embodiment of the present application, the write circuit module 40 includes a write conversion circuit 41, and a data bus buffer module 30, a global data line YIO, a local data line LIO, and a complementary local data line LIO_, all are electrically connected, for transmitting the data on the global data line YIO to the complementary local data line LIO_ when the comparison result indicated by the data polarity identification signal pl exceeds a preset threshold, and when the indicated comparison result is that the data polarity identification signal pl does not exceed the preset threshold, the data on the global data line YIO is transmitted to the local data line LIO.

Refer more to FIG. 2, when the comparison result indicated by the data polarity identification signal pl exceeds the preset threshold, the global data on the global data line YIO is transmitted to the complementary local data line LIO_, and when the comparison result indicated by the data polarity identification signal pl does not exceed the preset threshold, the global data on the global data line YIO is transmitted to the local data line LIO, so that the bus data on the data bus can be accurately transmitted to the local data line LIO, or the complementary local data line LIO_, thereby reducing the number of flips during data transmission, so as to effectively reduce the data passing through the data bus, the global data line YIO and the local data line LIO, or the data passing through the data bus, the global data line YIO and the complementary local data line LIO_, so power consumption reduced during transmission.

Figure 3:
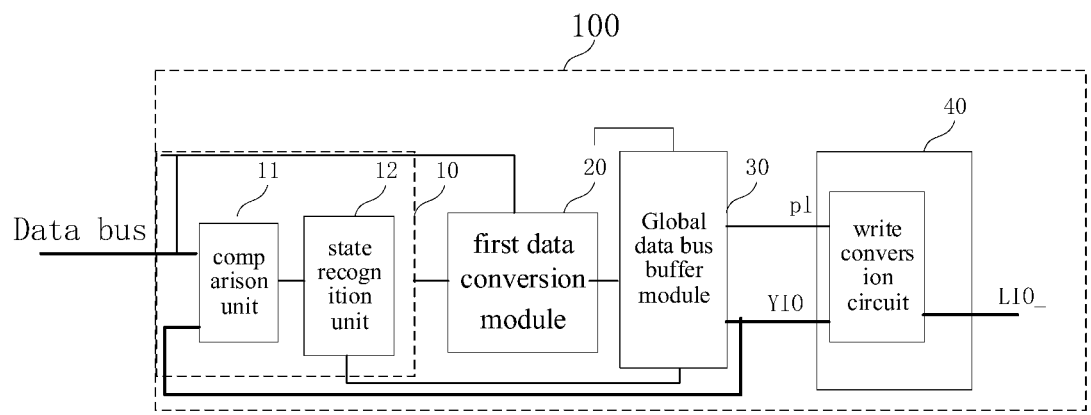
FIG. 3 is a schematic diagram of the circuit overview of a data transmission circuit provided in the third embodiment of this application.

FIG. 3 shows an embodiment of the present application, the preset threshold can be set to half of the preset bit width; the comparison module 10 includes a comparison unit 11 and a state recognition unit 12, and the comparison unit 11 is used to compare the data bus on the data bus line and the global data on the global data line YIO which are compared bit by bit, and the comparison status data of each bit is at the output; the status identification unit 12 is electrically connected to the comparison unit 11 for comparing the status data of each bit for performing statistics, and outputting the comparison result according to the statistics result.

Figure 4A:
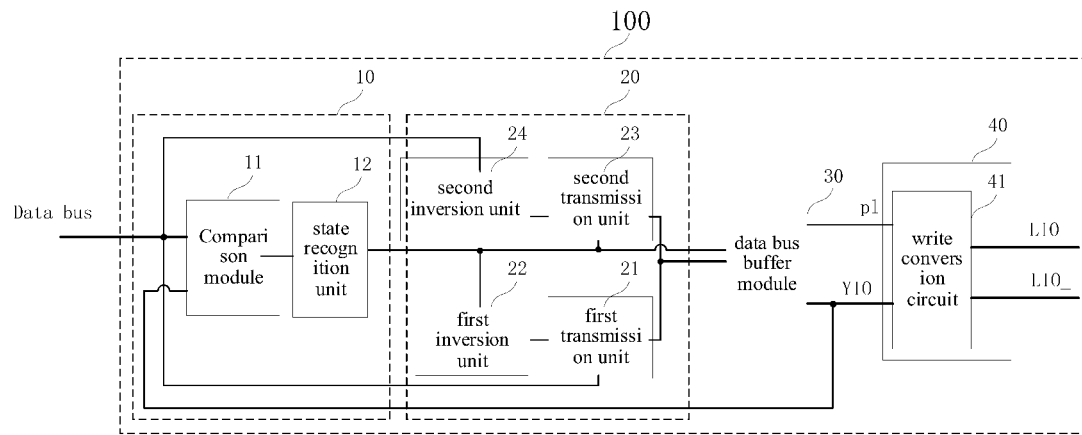
FIG. 4a is a schematic diagram of the circuit overview of a data transmission circuit provided in the fourth embodiment of the application.
Figure 4B:
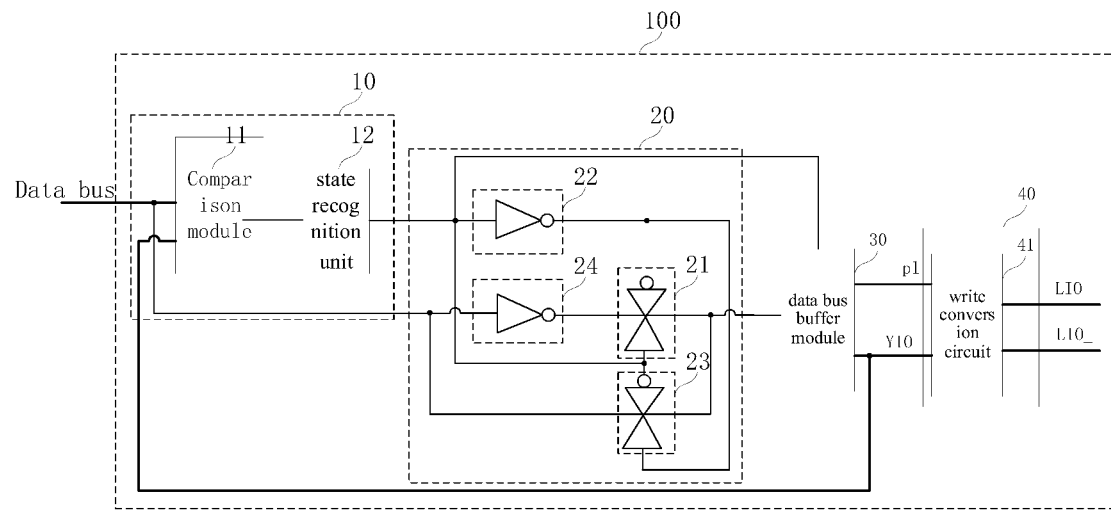

FIGS. 4a and 4b show an embodiment of the present application, the first data conversion module 20 includes a first transmission unit 21, a first inversion unit 22, a second transmission unit 23, and a second inversion unit 24. The first transmission unit 21 is electrically connected to the data bus, the data bus buffer module 30, and is electrically connected to the output terminal of the status recognition unit 12 through the first inversion unit 22, and is used for when the comparison result does not exceed the preset value. In the case of a threshold value, the bus data is transmitted to the data bus buffer module 30; the second transmission unit 23 is electrically connected to the data bus buffer module 30, the output terminal of the status identification unit 12, and is connected to the data bus through the second inverting unit 24 The data bus is electrically connected to the data bus buffer module 30 after inverting the bus data when the comparison result exceeds the preset threshold.

Figure 5:
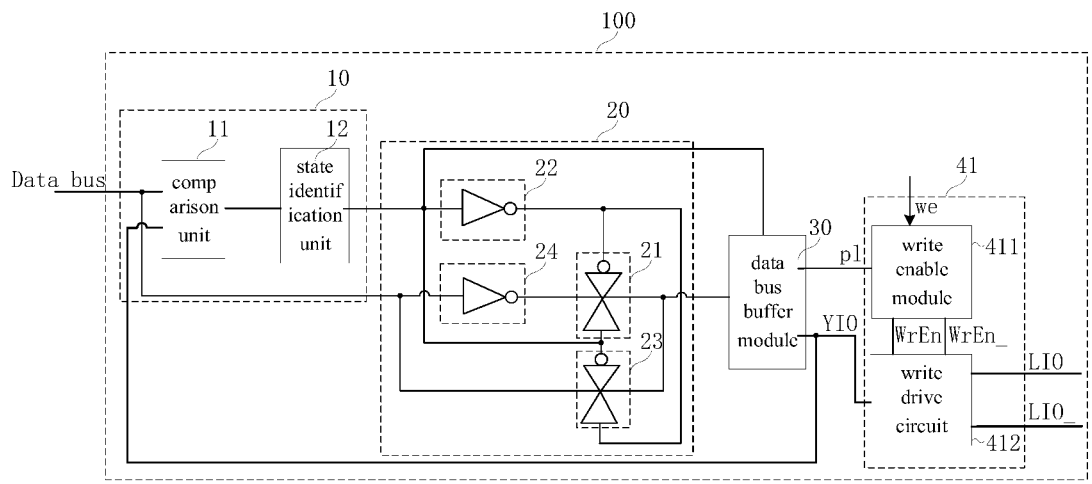
FIG. 5 is a schematic diagram of the circuit overview of a data transmission circuit provided in the fifth embodiment of this application.

FIG. 5 shows an embodiment of the present application. The write conversion circuit 41 includes a write enable module 411 and a write drive circuit 412, the write enable module 411 generates identification signal pl according to the data polarity and the initial write enable signal WrEn and write enable inverse signal WrEn_; write drive circuit 412 is used to generate a third data according to write enable signal WrEn, write enable inverse signal WrEn_ and global data on global data line YIO, and combine all the third data is transmitted to the local data line LIO or the complementary local data line LIO_. For example, the write conversion circuit 41 can be set to transmit the global data on the global data line YIO to the complementary local data line LIO_, when the comparison result indicated by the data polarity identification signal pl exceeds a preset threshold. When the comparison result indicated by the signal pl does not exceed the preset threshold, the global data on the global data line YIO is transmitted to the local data line LIO.

Figure 6:
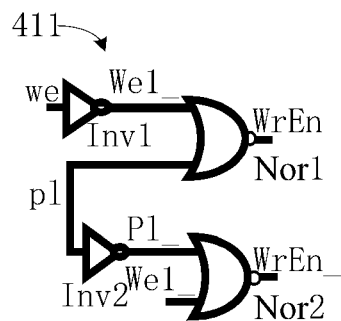
FIG. 6 is a schematic circuit diagram of a write enable module in a data transmission circuit provided in an embodiment of the application.

FIG. 6 shows an embodiment of the present application, the write enable module 411 includes a first inverter Inv1, a first NOR gate Nor1, a second inverter Inv2, and a second NOR gate Nor2. The inverter Inv1 is configured to be: the input terminal is electrically connected to the initial write enable signal we, and the output terminal outputs the first write enable inverse signal We1_; the first NOR gate Nor1 is configured to be: the input terminal is electrically connected to the data polarity identification signal Pl and the output terminal of the first inverter is Inv1, the output terminal outputs the write enable signal WrEn; the second inverter Inv2 is configured to be: the input terminal is electrically connected to the data polarity identification signal pl, and the output terminal outputs the data polarity identification reverse signal Pl_; the second NOR gate Nor2 is configured as: the input terminal is electrically connected to the output terminal of the second inverter Inv2 and the output terminal of the first inverter Inv1, and the output terminal outputs the write enable inverse signal WrEn_.

Figure 7:
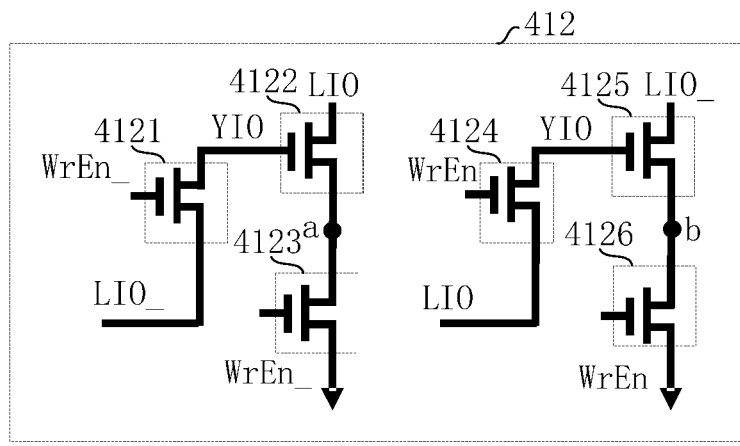
FIG. 7 is a schematic circuit diagram of a write driving circuit in a data transmission circuit provided in an embodiment of the application.

FIG. 7 shows an embodiment of the present application, the write drive circuit 412 includes a first switch unit 4121, a second switch unit 4122, a third switch unit 4123, a fourth switch unit 4124, a fifth switch unit 4125, and a six switch units 4126. The first switch unit 4121 is configured to electrically connect the complementary local data line LIO_ and the global data line YIO according to the write enable inversion signal WrEn_; the second switch unit 4122 is configured as: the control terminal is electrically connected to the global data line YIO, the first terminal is electrically connected to the local data line LIO, and the second terminal is electrically connected to the first node a; the third switch unit 4123 is configured to electrically connect the first node a and ground according to the write enable inverse signal WrEn_; the fourth switch unit 4124 is configured to electrically connect the local data line LIO and the global data line YIO according to the write enable signal WrEn; the fifth switch unit 4125 is configured as: the control terminal is electrically connected to the global data line YIO, the first terminal is electrically connected to the complementary local data line LIO_. The two terminals are electrically connected to the second node b; the sixth switch unit 4126 is configured to electrically connect the second node b and ground according to the write enable signal WrEn.

Figure 8:
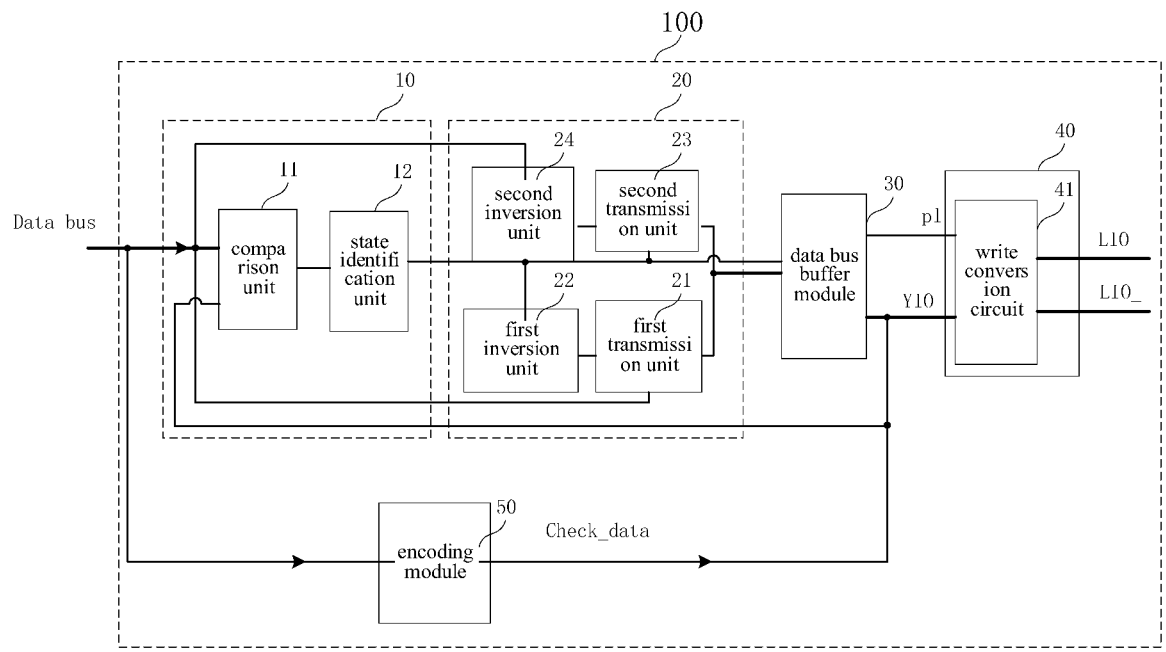
FIG. 8 is a schematic diagram of the circuit overview of a data transmission circuit provided in the eighth embodiment of this application.

FIG. 8 is an embodiment of the present application, the data transmission circuit 100 further includes an encoding module 50. The encoding module 50 is electrically connected to the global data line YIO and the data bus. The bus data on the data bus generates check code data Check_data, and transmits the check code data Check_data to the global data line YIO.

Figure 9:
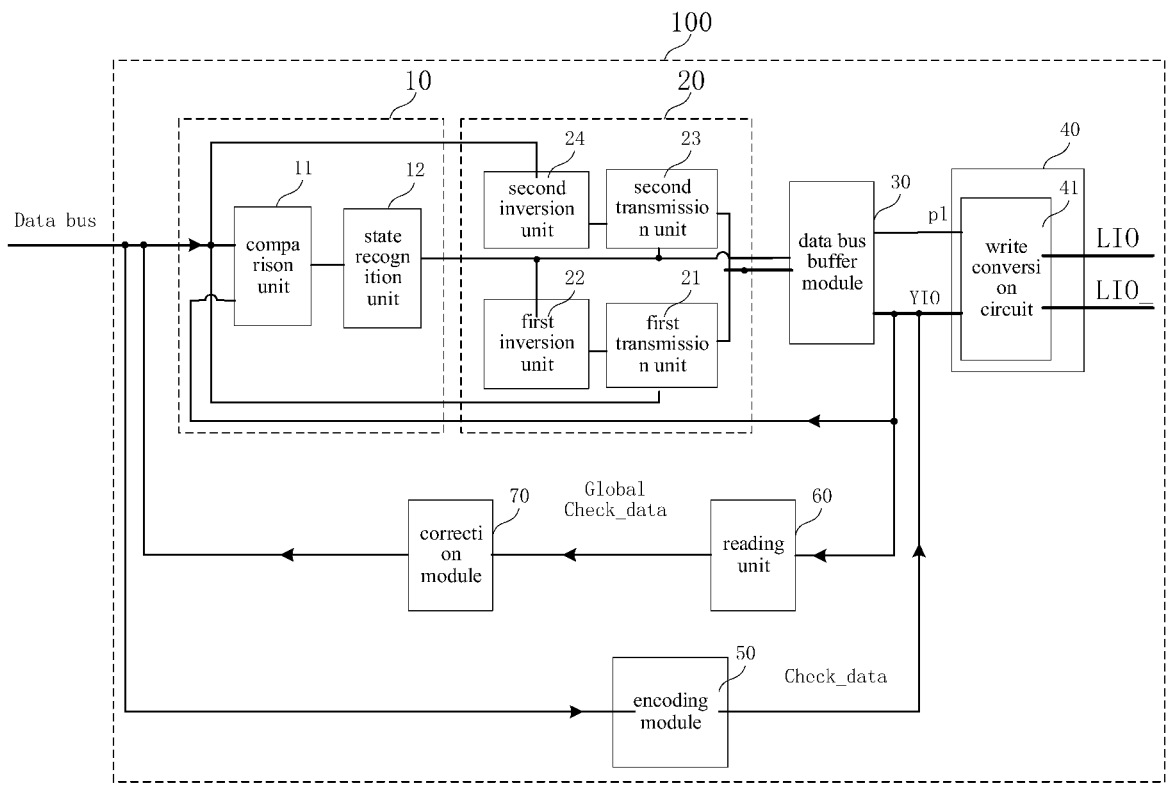
FIG. 9 is a schematic diagram of the circuit overview of a data transmission circuit provided in the ninth embodiment of this application.

Please refer to FIG. 9, in an embodiment of the present application, the data transmission circuit 100 further includes a reading unit 60 and a correction module 70. The reading unit 60 reads the global data on the global data line YIO and the data on the global data line YIO Check code data; the correction module 70 is electrically connected to the reading unit 60 and the data bus Data bus, and is used to receive the global data on the global data line YIO and the check code on the global data line YIO Check_data, according to the check code data Check_data, performs error detection and/or error correction on the global data on the global data line YIO, generates corrected data, and transmits the corrected data to the data bus.

As an example, FIG. 9 shows one of the embodiments, the encoding module 50 includes an error correction code (ECC) encoding unit, and the ECC encoding unit verifies the global data on the global data line YIO, and can generate an ECC check code, so that The correction module 70 can perform error detection and/or error correction on the global data on the global data line YIO according to the ECC check code and generate corrected data to ensure the accuracy of the read data.

Figure 10:
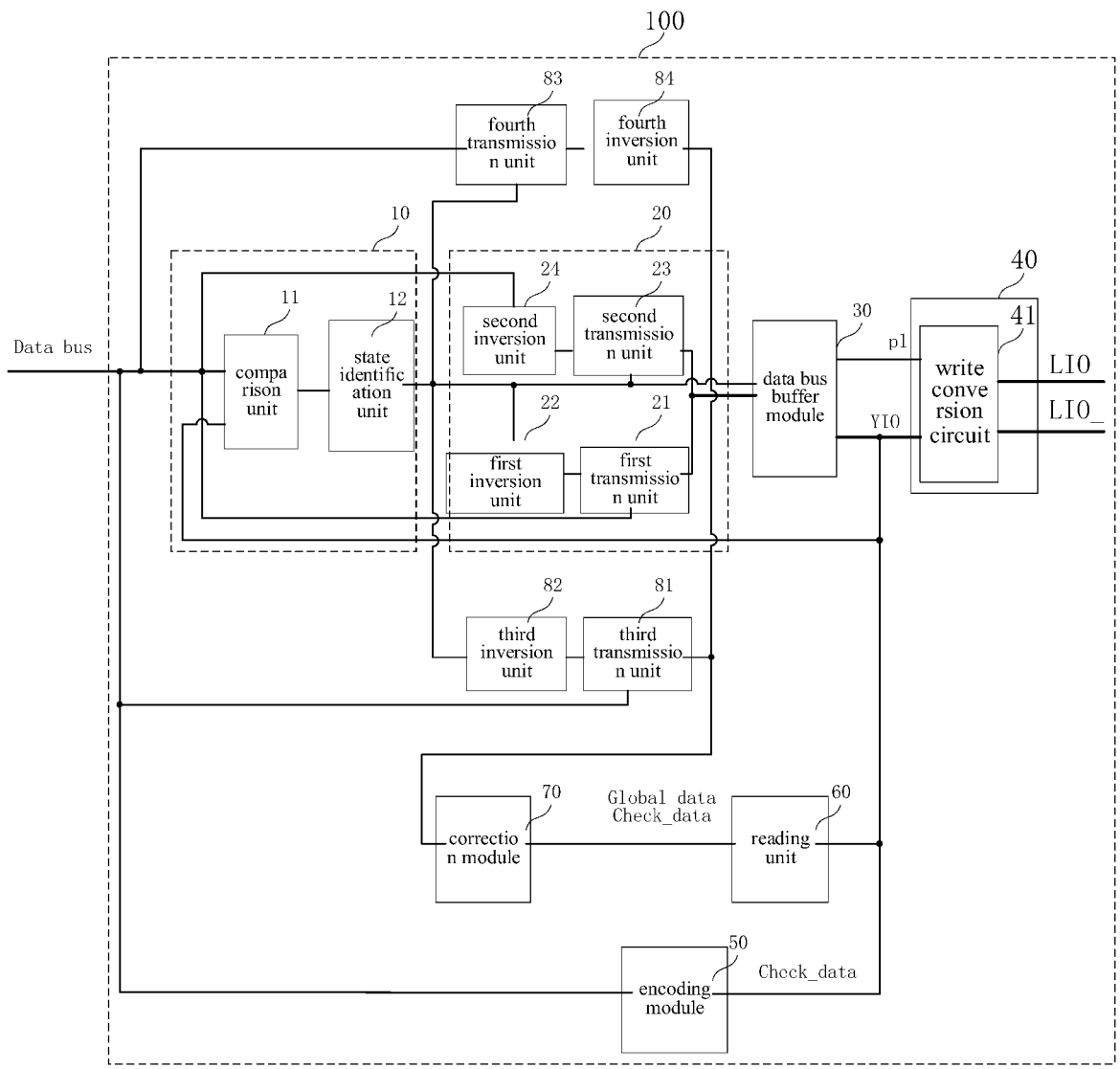
FIG. 10 is a schematic diagram of the circuit overview of a data transmission circuit provided in the tenth embodiment of this application.

FIG. 10 shows an embodiment of the present application. The data transmission circuit 100 further includes a second data conversion module (not shown), and the second data conversion module includes a third transmission unit 81, a third inversion unit 82, the fourth transmission unit 83 and the fourth inversion unit 84. The third transmission unit 81 is electrically connected to the data bus and the correction module 70, and is electrically connected to the output terminal of the comparison module 10 through the third inversion unit 82. When the comparison result does not exceed the preset threshold, the corrected data is transmitted to the data bus; the fourth transmission unit 83 is electrically connected to the data bus and the output terminal of the comparison module 10, and passes through the fourth inverting unit 84 is electrically connected to the correction module 70, and is used to invert the corrected data and transmit the corrected data to the data bus when the comparison result exceeds the preset threshold, so as to ensure the accuracy of the read data under the premise, the number of flips during data transmission through the global data line and data bus is reduced, so as to effectively reduce the power consumption in the process of data transmission through the global data line and data bus.

Figure 11:
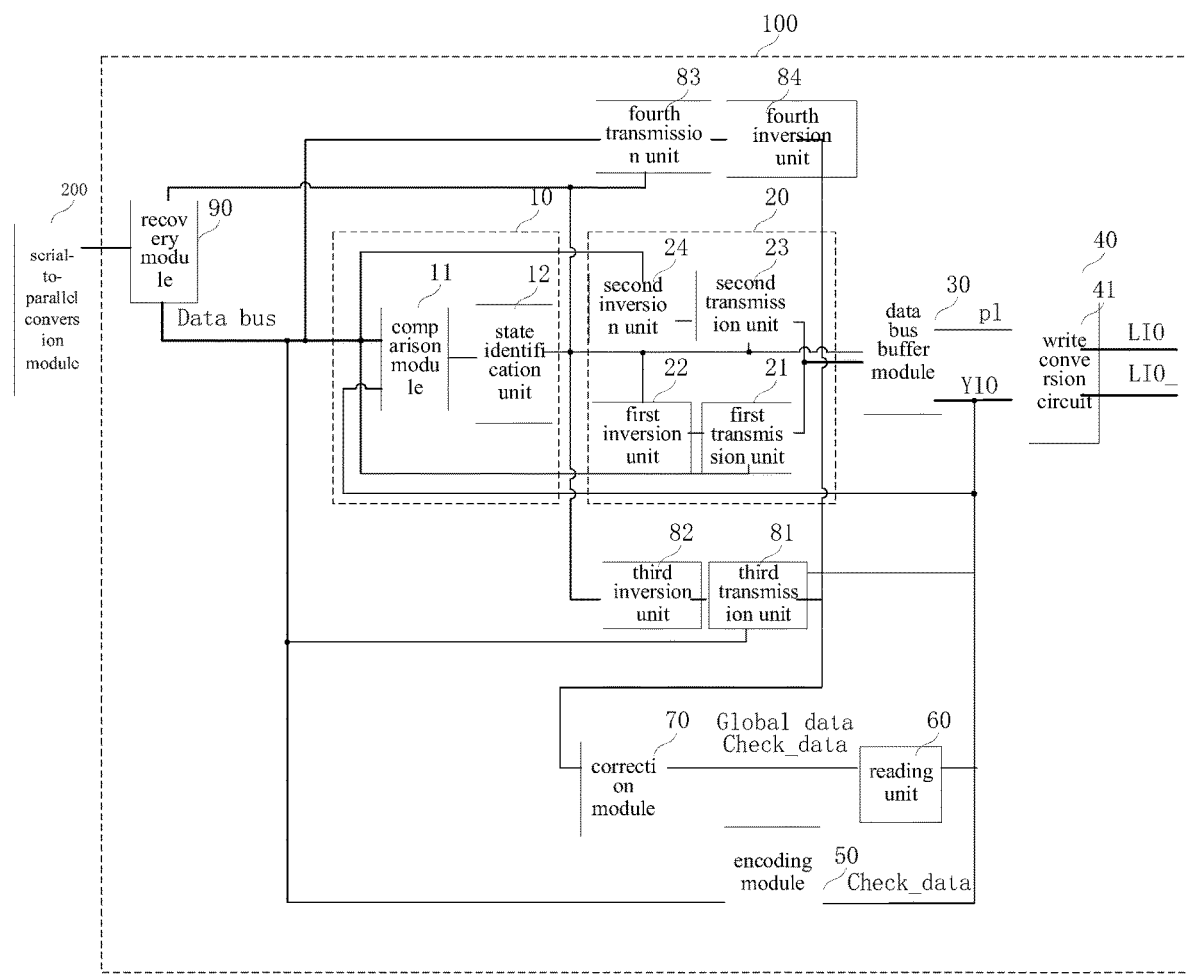
FIG. 11 is a schematic diagram of the circuit overview of a data transmission circuit provided in the eleventh embodiment of this application.

FIG. 11 shows an embodiment of the present application, the data transmission circuit 100 further includes a recovery module 90. The recovery module 90 is electrically connected to the comparison module 10, the data bus, and the serial-to-parallel conversion module 200 for comparison. The comparison result output by the comparison module 10 transmits the data on the data bus or the inverted data to the serial-to-parallel conversion module 200 to restore the inverted data of the second data conversion module to ensure the accuracy of the read data.

Further, in an embodiment of the present application, a storage device is provided, including any of the data transmission circuit 100 described in the embodiments of the present application, for storing and transmitting data of a read operation or a write operation.

Regarding the specific limitation of the storage device in the foregoing embodiment, reference may be made to the specific limitation of the data transmission circuit 100 above, which will not be repeated here.

Figure 12:
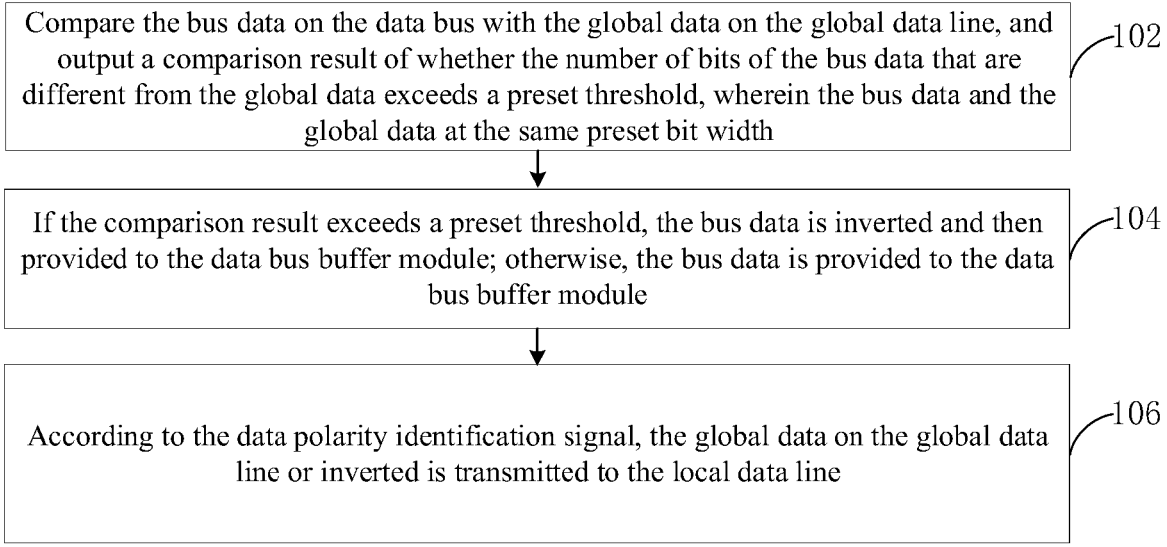
FIG. 12 is a schematic flowchart of a data transmission method provided in one embodiment of this application.

Further, referring to FIG. 12, in an embodiment of the present application, a data transmission method is provided, including:

Step 102: Compare the bus data on the data bus with the global data on the global data line, and output a comparison result of whether the number of bits of the bus data that are different from the global data exceeds a preset threshold, wherein the bus data and the global data at the same preset bit width;

Step 104: If the comparison result exceeds a preset threshold, the bus data is inverted and then provided to the data bus buffer module; otherwise, the bus data is provided to the data bus buffer module, wherein the data bus buffer module is configured to generate a data polarity identification signal according to the comparison result, and is configured to transmit the bus data or the inverted data of the bus data to the global data line;

Step 106: According to the data polarity identification signal, the global data on the global data line or inverted is transmitted to the local data line.

Specifically, please continue to refer to FIG. 12, by comparing the bus data on the data bus with the global data on the global data line, and outputting the result, which shows whether the number of bits of the bus data different from the global data have exceeded a preset threshold, herein the bus data and the global data have the same preset bit width. In the case that the comparison result exceeds the preset threshold, the bus data is inverted and provided to the data bus buffer module. Conversely, the bus data is provided to the data bus buffer module, herein the data bus buffer module generates a data polarity identification signal according to the comparison result, and transmits the bus data or the inverted to the global data line. The write circuit module can be set to transmit the global data on the global data line or inverted to the local data line according to the data polarity identification signal. The local data line and the complementary local data line transmit signals with opposite phases. Since the transmitted data generally includes a data string composed of 0 and 1, the power-saving algorithm is used to write data to the storage unit array via the data bus and the number of flips during the data transfer process, so as to effectively reduce the number of data passing through the data bus and the power consumption during writing to the storage unit array. Therefore, the energy consumption of the semiconductor storage device is reduced while ensuring that the density and number of storage units in the storage unit array are not reduced.

Figure 13:
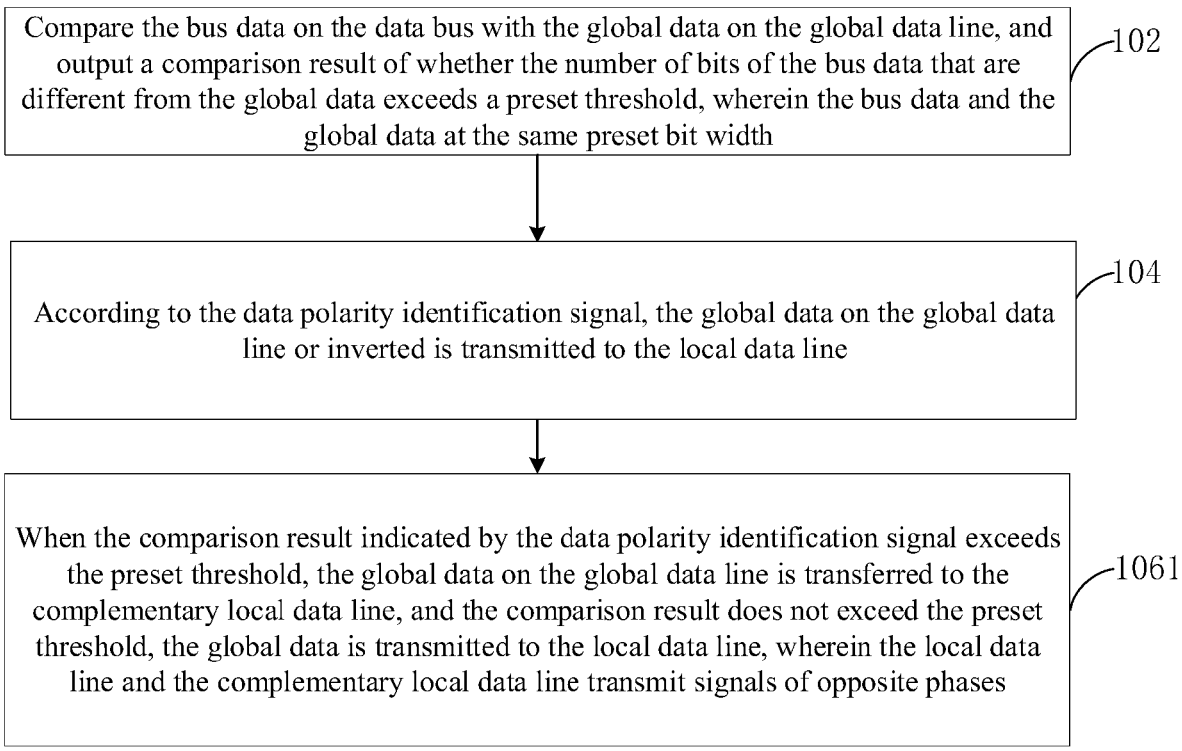
FIG. 13 is a schematic flowchart of a data transmission method provided in another embodiment of this application.

Further, please refer to FIG. 13, in an embodiment of the present application, the preset threshold value is half of the preset bit width, and the data polarity identification signal transmits the global data or the inverted data to the local data line. The embodiment in addition to Step 102 and Step 104, further includes:

Step 1061: When the comparison result indicated by the data polarity identification signal exceeds the preset threshold, the global data on the global data line is transferred to the complementary local data line, and the comparison result does not exceed the preset threshold, the global data is transmitted to the local data line, wherein the local data line and the complementary local data line transmit signals of opposite phases.

As an example, please continue to refer to FIG. 13, by applying the power-saving algorithm in the data transfer process through the data bus, global data line, local data line, or write data through the data bus, global data line and complementary local data line. The number of times to effectively reduce the power consumption in the process of writing data through the data bus, the global data line and the local data line, or transmit the data through the data bus, the global data line and the complementary local data line. Therefore, while ensuring that the density and number of storage units in the storage unit array are not reduced, the energy consumption of the semiconductor storage device in the process of writing data is reduced.

In an embodiment of the present application, a computer-readable storage medium is provided, and a computer program is stored thereon, and the computer program implements any data transmission method described in the embodiment of the present application when the computer program is executed by a processor.

It should be understood that although the various steps in the flowcharts of FIG. 12 and FIG. 13 are displayed in sequence as indicated by the arrows, these steps are not necessarily performed in sequence in the order indicated by the arrows. Unless there is a clear description in this article, there is no strict order for the execution of these steps, and these steps can be executed in other orders. Moreover, at least part of the steps in FIG. 12 and FIG. 13 may include multiple steps or multiple stages. These steps or stages are not necessarily executed at the same time, but can be executed at different times. The order of execution is not necessarily performed sequentially, but may be performed alternately with other steps or at least a part of the steps or stages in other steps.

A person of ordinary skill in the art can understand that all or part of the processes in the above-mentioned embodiment methods can be implemented by instructing relevant hardware through a computer program. The computer program can be stored in a non-volatile computer readable storage. In the medium, when the computer program is executed, it may include the procedures of the above-mentioned method embodiments. Wherein, any reference to memory, storage, database or other media used in the embodiments provided in this application may include non-volatile and/or volatile memory. Non-volatile memory may include read-only memory (ROM), programmable ROM (PROM), electrically programmable ROM (EPROM), electrically erasable programmable ROM (EEPROM), or flash memory. Volatile memory may include random access memory (RAM) or external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronous chain Channel (Synchlink) DRAM (SLDRAM), direct memory bus dynamic RAM (DRDRAM), and memory bus dynamic RAM (RDRAM), etc.

Please note that the above-mentioned embodiments are only for illustrative purposes and are not meant to limit the present disclosure.

The technical features of the above-mentioned embodiments can be combined arbitrarily. In order to make the description concise, all possible combinations of the various technical features of the above-mentioned embodiments are not described. However, as long as there is no contradiction in the combination of these technical features, they should be It is considered as the range described in this specification.

The above-mentioned embodiments only express several implementation modes of the present application, and their descriptions are relatively specific and detailed, but they should not be understood as limiting the scope of the patent application. It should be pointed out that for those of ordinary skill in the art, without departing from the concept of this application, several modifications and improvements can be made, all of which fall within the protection scope of this application. The scope of protection of the patent in this application shall be subject to the appended claims.

The invention claimed is:

1. A data transmission circuit, comprising:
a comparison module configured to receive bus data from a data bus and global data from a global data line, wherein the comparison module compares the bus data with the global data, and outputs a comparison result, wherein the comparison result shows whether a number of different bits between the bus data and the global data exceeds a preset threshold; wherein the bus data and the global data have a same preset bit width;
a first data conversion module, electrically connected to the data bus, the comparison module, and the global data line, wherein the first data conversion module is configured to invert the bus data and output an inverted data, if the comparison result exceeds a preset threshold, and output the bus data if the comparison result does not exceed the preset threshold;
a data bus buffer module, electrically connected to the first data conversion module, the comparison module, and the global data line, wherein the data bus buffer model in configured to generate a data polarity identification signal according to the comparison result, and transmit the bus data or the inverted data of the bus data to the global data line; and
a write circuit module, electrically connected to the data bus buffer module, the global data line, a local data line, and a complementary local data line, wherein the write circuit module is configured to transmit the global data or an inverted data of the global data according to the data polarity identification signal, from the global data line to the local data line, wherein the local data line and the complementary local data line transmit signals with opposite phases.

2. The data transmission circuit according to claim 1, wherein the write circuit module comprises:
a write conversion circuit, electrically connected to the data bus buffer module, the global data line, the local data line, and the complementary local data line, wherein the write conversion circuit is configured to transmit the global data to the complementary local data line when the comparison result, indicated by the data polarity identification signal, exceeds the preset threshold, and transmit the global data to the local data line when the comparison result does not exceed the preset threshold.

3. The data transmission circuit according to claim 2, wherein the preset threshold is half of the preset bit width; wherein the comparison module comprises:
a comparison unit configured to compare the bus data and the global data bit by bit, and output a comparison status data of each bit; and
a status recognition unit, electrically connected to the comparison unit, wherein the status recognition unit is configured to perform statistics on the comparison status data of each bit, and output the comparison result according to the statistics.

4. The data transmission circuit according to claim 3, wherein the first data conversion module comprises:
a first transmission unit, electrically connected to the data bus, the data bus buffer module, and an output terminal of the status recognition unit through a first inversion unit, wherein the first transmission unit transmits the bus data to the data bus buffer module when the comparison result does not exceed the preset threshold; and
a second transmission unit, electrically connected to the data bus buffer module, the output terminal of the status recognition unit, and the data bus through a second inversion unit, wherein the bus data is inverted and transmitted to the data bus buffer module when the comparison result exceeds the preset threshold.

5. The data transmission circuit according to claim 2, wherein the write conversion circuit comprises:
a write enable module, configured to generate a write enable signal and a write enable inverse signal according to the data polarity identification signal and an initial write enable signal; and
a write drive circuit, configured to generate a third data according to the write enable signal, the write enable inverse signal, and the global data, and to transmit the third data to the local data line or the complementary local data line.

6. The data transmission circuit according to claim 5, wherein the write enable module comprises:
a first inverter, configured to have an input terminal electrically connected to the initial write enable signal, and an output terminal to output a first write enable inverse signal;

a first NOR gate, configured to have an input terminal electrically connected to the data polarity identification signal and an output terminal of the first inverter, wherein the first NOR gate outputs the write enable signal from an output terminal;

a second inverter configured to have an input terminal electrically connected to the data polarity identification signal, wherein the second inverter outputs a data polarity identification reverse signal from an output terminal; and a second NOR gate, configured to have an input terminal electrically connected to the output terminal of the second inverter and the output terminal of the first inverter, wherein the second NOR gate outputs the write enable inverse signal from an output terminal.

7. The data transmission circuit according to claim 5, wherein the write drive circuit comprises:

a first switch unit configured to electrically connect the complementary local data line and the global data line according to the write enable reverse signal;

a second switch unit comprising a control terminal electrically connected to the global data line, a first terminal electrically connected to the local data line, and a second terminal is electrically connected to a first node;

a third switch unit, configured to electrically connect to the first node and a ground according to the write enable reverse signal;

a fourth switch unit, configured to electrically connect to the local data line and the global data line according to the write enable signal;

a fifth switch unit comprising a control terminal electrically connected to the global data line, a first terminal electrically connected to the complementary local data line, and a second terminal electrically connected to a second node; and a sixth switch unit, configured to electrically connect to the second node and the ground according to the write enable signal.

8. The data transmission circuit according to claim 1, further comprising:

an encoding module, electrically connected to both the global data line and the data bus, wherein the encoding module generates check code data according to the bus data on the data bus during a write operation, and transmits the check code data to the global data line.

9. The data transmission circuit according to claim 8, wherein the encoding module comprises an error correction code (ECC) encoding unit.

10. The data transmission circuit according to claim 8, further comprising:

a reading unit for reading the global data on the global data line and the check code data on the global data line; and a correction module, electrically connected to the reading unit and the data bus, wherein the correction module receives the global data from the global data line and the check code data from the global data line, and performs error detection and/or error correction to the global data to generate corrected data according to the check code data.

11. The data transmission circuit according to claim 10, further comprising a second data conversion module, wherein the second data conversion module comprises:

a third transmission unit, electrically connected to the data bus, the correction module, and an output terminal of the comparison module through a third inversion unit, wherein the third transmission unit transmits the corrected data to the data bus when the comparison result does not exceed the preset threshold; and a fourth transmission unit, electrically connected to the data bus and the output terminal of the comparison module, and the correction module through a fourth inverting unit, wherein the fourth transmission unit inverts and then transmits the corrected data to the data bus when the comparison result exceeds the preset threshold.

12. The data transmission circuit according to claim 11, further comprising:

a recovery module, electrically connected to the comparison module, the data bus, and a serial-to-parallel conversion module, and wherein the recovery module transmits the bus data or the inverted data to the serial-to-parallel conversion module according to the comparison result.

13. A storage device, comprising a data transmission circuit according to claim 1, wherein the data transmission circuit stores and transmits data of a read operation or a write operation.

14. A data transmission method, comprising:

comparing bus data on a data bus with global data on a global data line, and outputting a comparison result of whether a number of bits of the bus data being different from the global data exceeds a preset threshold, wherein the bus data and the global data have a same preset bit width;

inverting the bus data and providing to the inverted bus data to a data bus buffer module if the comparison result exceeds the preset threshold; otherwise, providing the bus data to the data bus buffer module, wherein the data bus buffer module generates a data polarity identification signal according to the comparison result, and wherein the data bus buffer module transmits the bus data or the inverted bus data to the global data line; and transmitting the global data from the global data line or the inverted data to a local data line according to the data polarity identification signal.

15. The data transmission method according to claim 14, wherein the preset threshold is half of the preset bit width, and wherein transmitting the global data from the global data line or the inverted data to the local data line according to the data polarity identification signal comprises:

transmitting the global data on the global data line to a complementary local data line, if the comparison result indicated by the data polarity identification signal exceeds the preset threshold; and transmitting the global data to the local data line, if the comparison result does not exceed the preset threshold;

wherein the local data line and the complementary local data line transmit signals of opposite phases.

* * * * *